US 6,730,563 B2

(12) United States Patent
Matsumura

(10) Patent No.: US 6,730,563 B2
(45) Date of Patent: May 4, 2004

(54) METHOD OF MANUFACTURING SEMICONDUCTOR DEVICE

(75) Inventor: Akira Matsumura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/365,641

(22) Filed: Feb. 13, 2003

(65) Prior Publication Data

US 2004/0053463 A1 Mar. 18, 2004

(30) Foreign Application Priority Data

Sep. 13, 2002 (JP) ........................ 2002-267812

(51) Int. Cl.[7] ...................... H01L 21/8242; H01L 21/20
(52) U.S. Cl. .................. 438/255; 438/253; 438/254; 438/396; 438/397; 438/398; 257/303; 257/306; 257/309
(58) Field of Search .................. 438/239–242, 438/253–256, 396–399; 257/303–310

(56) References Cited

U.S. PATENT DOCUMENTS 6,069,038 A * 5/2000 Hashimoto et al. ......... 438/241
6,077,738 A * 6/2000 Lee et al. .................... 438/241
6,399,438 B2 * 6/2002 Saito et al. .................. 438/253
6,461,911 B2 * 10/2002 Ahn et al. ................... 438/253
6,562,679 B2 * 5/2003 Lee et al. .................... 438/253
2002/0119623 A1 * 8/2002 Park et al. ................... 438/253

FOREIGN PATENT DOCUMENTS

JP          11-17144           1/1999
JP          P2000-196038 A     7/2000

* cited by examiner

*Primary Examiner*—John F. Niebling
*Assistant Examiner*—Jennifer M. Kennedy
(74) *Attorney, Agent, or Firm*—McDermott, Will & Emery

(57) ABSTRACT

A rough polysilicon film located on the upper surface of an interlayer film is removed by a CMP process, so that storage nodes and an embedded TEOS film are formed. The embedded TEOS film is removed concurrently with the interlayer film located in a memory cell region by etching. An opening end of a groove, the upper surface of the embedded TEOS film and the upper surface of the interlayer film are arranged on substantially the same plane. In the memory cell region and a peripheral circuit region, a substantially flat interlayer insulation film is obtained. This solves the problems of a step, falling and the like in a semiconductor device including a capacitor element.

4 Claims, 25 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and particularly, to a method of manufacturing a semiconductor device including a capacitor.

2. Description of the Background Art

One of semiconductor memory devices includes a dynamic random-access memory (hereinafter referred to as "DRAM"). As semiconductor memory devices have reduced in size, a cylindrical capacitor has been employed in the DRAM for securing a capacitance of the capacitor storing electrical charge as information.

An example of a method of manufacturing a DRAM including such a cylindrical capacitor will be described. First, as shown in FIG. 29, a semiconductor substrate 102 is divided into a memory cell region M and a peripheral circuit region P. A memory cell is formed in memory cell region M, whereas a circuit for controlling the memory cell is formed in peripheral circuit region P.

A prescribed memory cell transistor (not shown) is formed on a portion of semiconductor substrate 102 in memory cell region M. A silicon oxide film 104 is formed on semiconductor substrate 102 so as to cover the memory cell transistor.

Prescribed bit lines 107a, 107b are formed on silicon oxide film 104. A silicon oxide film 106 is further formed on silicon oxide film 104 so as to cover bit lines 107a, 107b.

Next, prescribed storage node contact holes 105a, 105b are formed at silicon oxide films 104, 106. Plugs 103a, 103b of e.g. a polysilicon film are formed in storage node contact holes 105a, 105b, respectively.

Subsequently, an interlayer film 108 is formed on silicon oxide film 106. At interlayer film 108, openings 108a, 108b that expose plugs 103a, 103b, respectively, are formed. A capacitor will be formed in each of openings 108a, 108b.

Next, as shown in FIG. 30, a prescribed rough polysilicon film 110 is formed on interlayer film 108 and on the inner surfaces of openings 108a, 108b. Thereafter, as shown in FIG. 31, photoresists 119a, 119b are formed on rough polysilicon film 110 such that they are embedded in openings 108a, 108b.

The entire surface of exposed rough polysilicon film 110 is etched by e.g. electron beam (EB) using photoresists 119a, 119b as a mask, to remove rough polysilicon film 110 positioned on the upper surface of interlayer film 108.

Subsequently, photoresists 119a, 119b are removed. In addition, as shown in FIG. 32, interlayer film 108 is removed by e.g. a wet etching technique, so that cylindrical storage nodes 110a, 110b are formed.

Next, as shown in FIG. 33, a capacitor dielectric film 113 is formed covering storage nodes 110a, 110b. A cell plate 114 made of e.g. a polysilicon film is formed on capacitor dielectric film 113. Storage node 110a or 110b, capacitor dielectric film 113 and cell plate 114 constitute a capacitor C.

Next, as shown in FIG. 34, an interlayer insulation film 115 is formed on silicon oxide film 106 so as to cover capacitor C. At interlayer insulation film 115, a contact hole 115a that exposes cell plate 114 and contact hole 115b that exposes bit line 107b are formed.

A prescribed plug (not shown) is formed in each of contact holes 115a, 115b. A prescribed interconnection (not shown) electrically connected to the plug is formed on interlayer insulation film 115. Thus, a DRAM is completed.

The conventional DRAM, however, had the following problems. As described above, in the conventional DRAM, when storage nodes 110a, 110b each forming capacitor C are formed, interlayer film 108 is removed by wet etching, as shown in FIG. 32. Here, interlayer film 108 that lies in peripheral circuit region P is also removed.

Subsequently, as shown in FIG. 34, capacitor C is formed in memory cell region M, followed by interlayer insulation film 115 being formed while interlayer film 108 arranged in peripheral circuit region P has been removed.

Here, interlayer insulation film 115 covering capacitor C produces a relatively large step between memory cell region M and peripheral circuit region P. Such a step produced at interlayer insulation film 115 may deteriorate the accuracy of photolithography in forming e.g. contact holes 115a, 115b, which sometimes toughen control of the shape of openings.

Moreover, capacitor C is required to be taller in order to secure the capacitance of capacitor C, as DRAMs have been reduced in size. As the height of capacitor C increases, capacitor C including storage nodes 110a, 110b easily falls on silicon oxide film 106 at and after the process step shown in FIG. 32.

If capacitor C falls, electrical short circuit between memory cells (between bits) is induced, lowering the product yield.

Furthermore, when rough polysilicon film 110 positioned on the upper surface of the interlayer film 108 is removed, photoresists 119a, 119b are formed such that they are embedded in openings 108a, 108b as shown in FIG. 31, in order to protect rough polysilicon film 110 arranged within openings 108a, 108b.

Such a method, however, causes a problem in that an additional step is required for removing photoresists 119a, 119b embedded in openings 108a, 108b in addition to removal of interlayer film 108. Moreover, when the rough polysilicon film is removed, polysilicon grains in the rough polysilicon film are sputtered.

SUMMARY OF THE INVENTION

The present invention was made to solve the problems above, and an object thereof is to provide a method of manufacturing a semiconductor device that solves the problems of the steps, falling and the like in the semiconductor device including the capacitor element as described above.

A method of manufacturing a semiconductor device according to the present invention includes the following steps. A first element-forming region and a second element-forming region are formed on a main surface of a semiconductor substrate. A first insulation film is formed in the first element-forming region and the second element-forming region. A prescribed opening for forming a capacitor element is formed at a portion of the first insulation film located on the first element-forming region, while an annular groove continuously surrounding the first element-forming region is formed. A layer that is to be a first electrode of the capacitor element is formed on the first insulation film and on inner surfaces of the opening. A protection film for protecting the layer to be the first electrode located within the opening is formed in the opening. The layer to be the first electrode located on an upper surface of the first insulation film is removed, so that the first electrode is formed in the opening. A mask material that exposes the protection film and the portion of the first insulation film located in the first element-forming region and covers the annular groove and a portion of the first insulation film located in the second element-forming region is formed to remove at least a part of the first insulation film. The protection film is removed. A second electrode is formed on the first electrode from which the protection film is removed, with a dielectric film interposed in between, to form a capacitor element. A second insulation film is formed on the semiconductor substrate so as to cover the capacitor element. The step of forming the first electrode is performed by polishing.

According to the present method, the layer that is to be the first electrode located on the upper surface of the first insulation film is removed by polishing, so that the layer to be the first electrode can be prevented from being sputtered, compared to that removed by e.g. electron beam. In addition, the first insulation film located in the second element-forming region is left by the mask material at removal of a part of the first insulation film in the first element-forming region, allowing large reduction of a step produced between a portion of the second insulation film in the first element-forming region and that in the second element-forming region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
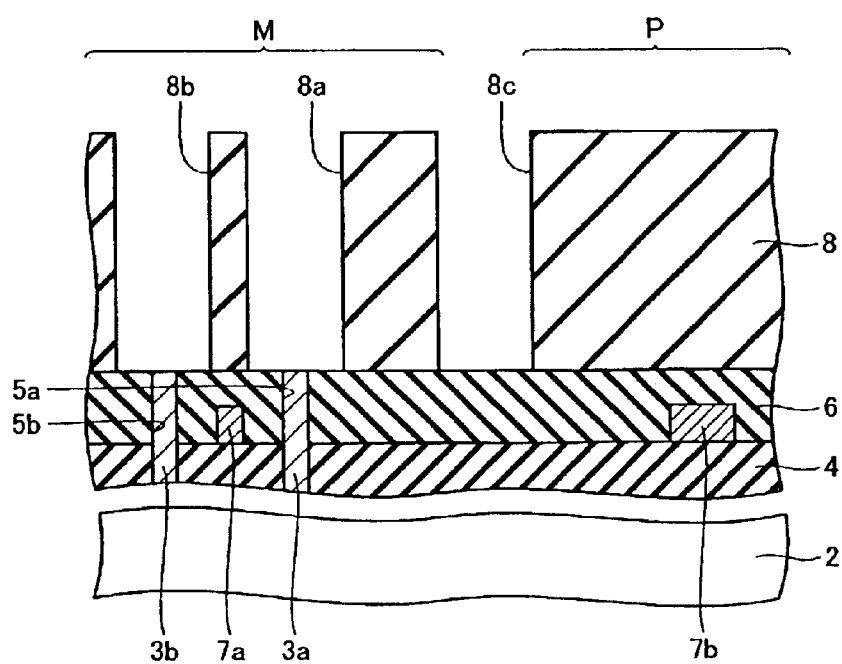
FIG. 1 is a section view showing one step of a method of manufacturing a semiconductor device according to the first embodiment of the present invention.

As the method of manufacturing a semiconductor device according to the first embodiment of the present invention, a method of manufacturing a DRAM including a cylindrical capacitor will be described. First, as shown in FIG. 1, a semiconductor substrate 2 is divided into a memory cell region M and a peripheral circuit region P. A memory cell is formed in memory cell region M, whereas a circuit for controlling the memory cell is formed in peripheral circuit region P.

A prescribed memory cell transistor (not shown) is formed on a portion of semiconductor substrate 2 in memory cell region M. A silicon oxide film 4 is formed on semiconductor substrate 2, by e.g. a CVD (Chemical Vapor Deposition) technique so as to cover the memory cell transistor.

Prescribed bit lines 7a, 7b are formed on silicon oxide film 4. A silicon oxide film 6 is further formed on silicon oxide film 4 by, for example, the CVD technique so as to cover bit lines 7a, 7b. Storage node contact holes 5a, 5b are formed on silicon oxide films 6, 4.

Plugs 3a, 3b made of a polysilicon film are formed in storage node contact holes 5a, 5b, respectively. Plugs 3a, 3b are electrically connected to the memory cell transistor (not shown).

Next, an interlayer film 8 made of a BPTEOS (Boro Phospho Tetra Ethyl Ortho Silicate glass) film having a thickness of approximately 1700 nm is formed on silicon oxide film 6 by e.g. the CVD technique. A prescribed photoresist pattern (not shown) is formed on interlayer film 8.

Interlayer film 8 is anisotropically etched by gas containing e.g. $C_5F_8$, $O_2$, Ar and the like, using the photoresist pattern as a mask, to form prescribed openings 8a, 8b and a groove 8c. The surfaces of plugs 3a, 3b are exposed at openings 8a, 8b, respectively, and a capacitor will be formed in each of openings 8a, 8b. Groove 8c is formed continuously surrounding memory cell region M.

Figure 2:
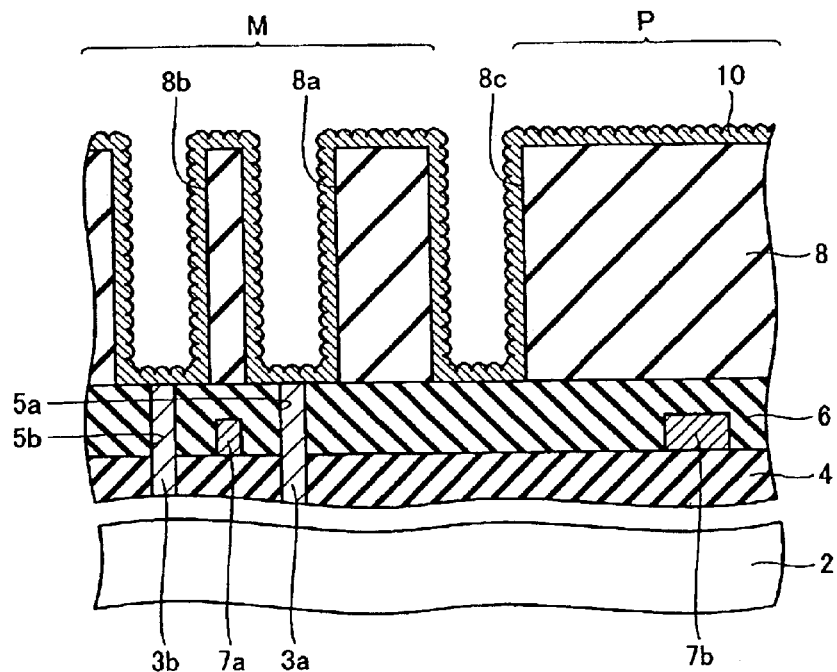
FIG. 2 is a section view showing the step subsequent to the step shown in FIG. 1 in the first embodiment.

Next, a doped polysilicon film (not shown) having a thickness of approximately 40 nm is formed on interlayer film 8 and on the inner surfaces of openings 8a, 8b and groove 8c by e.g. the CVD technique. A prescribed roughening process is performed on the doped polysilicon film, to form a rough polysilicon film 10 as shown in FIG. 2.

Figure 3:
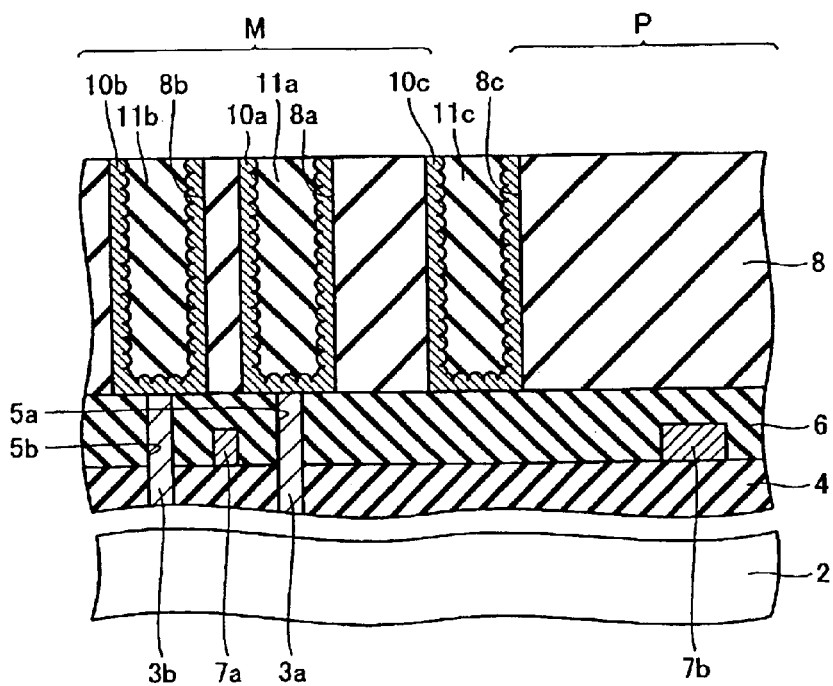
FIG. 3 is a section view showing the step subsequent to the step shown in FIG. 2 in the first embodiment.

Subsequently, a TEOS (Tetra Ethyl Ortho Silicate glass) film (not shown) is formed to fill in openings 8a, 8b and groove 8c by e.g. the CVD technique. A CMP (Chemical Mechanical Polishing) process is performed on the TEOS film, to remove the TEOS film and the rough polysilicon film located on an upper surface of interlayer film 8, so that embedded TEOS films 11a, 11b are formed within openings 8a, 8b, respectively, as shown in FIG. 3. Moreover, an embedded TEOS film 11c is formed within groove 8c.

The CMP process is thus performed, so that an opening end of groove 8c, an upper surface of embedded TEOS film 11c and the upper surface of interlayer film 8 are arranged on substantially the same plane.

Figure 4:
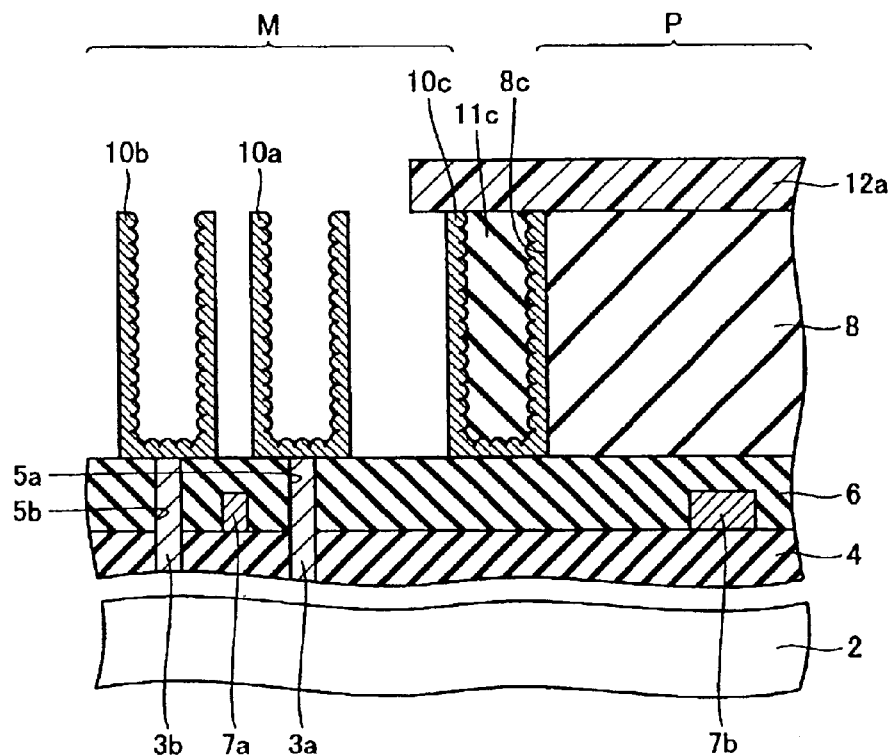
FIG. 4 is a section view showing the step subsequent to the step shown in FIG. 3 in the first embodiment.

Next, as shown in FIG. 4, a photoresist pattern 12a is formed so as to cover embedded TEOS film 11c and interlayer film 8 located in peripheral circuit region P. Wet etching by e.g. buffered hydrofluoric acid is performed using photoresist pattern 12a as a mask, to remove embedded TEOS films 11a, 11b and interlayer film 8 located in memory region M. Thus, cylindrical (tubular) storage nodes 10a, 10b are formed in memory cell region M.

Figure 5:
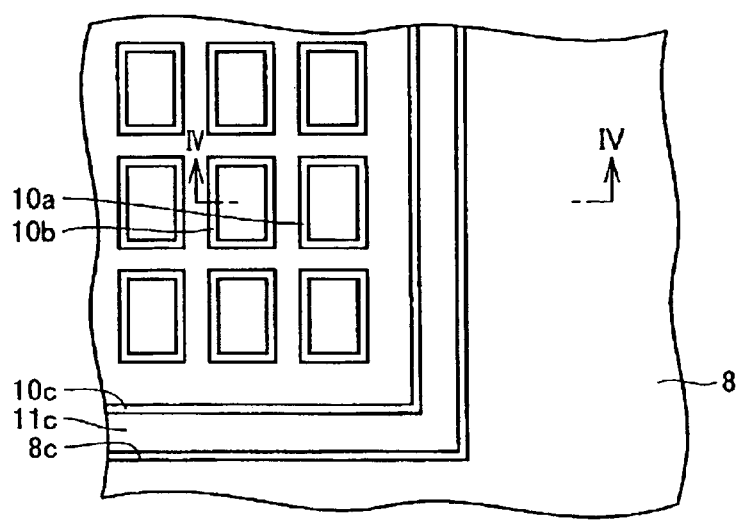
FIG. 5 is a plan view in the step shown in FIG. 4 in the first embodiment.

Subsequently, photoresist pattern 12a is removed. A planar structure with photoresist pattern 12a removed is shown in FIG. 5. As can be seen from FIGS. 4 and 5, tubular storage nodes 10a, 10b are exposed in memory cell region M. Peripheral circuit region P is covered by interlayer film 8.

Next, a prescribed dielectric film (not shown) that is to be a capacitor dielectric film is so formed as to cover the exposed storage nodes 10a, 10b. A polysilicon film (not shown) that is to be, for example, a cell plate is formed on the dielectric film. A prescribed photoresist pattern (not shown) is formed on the polysilicon film.

Figure 6:
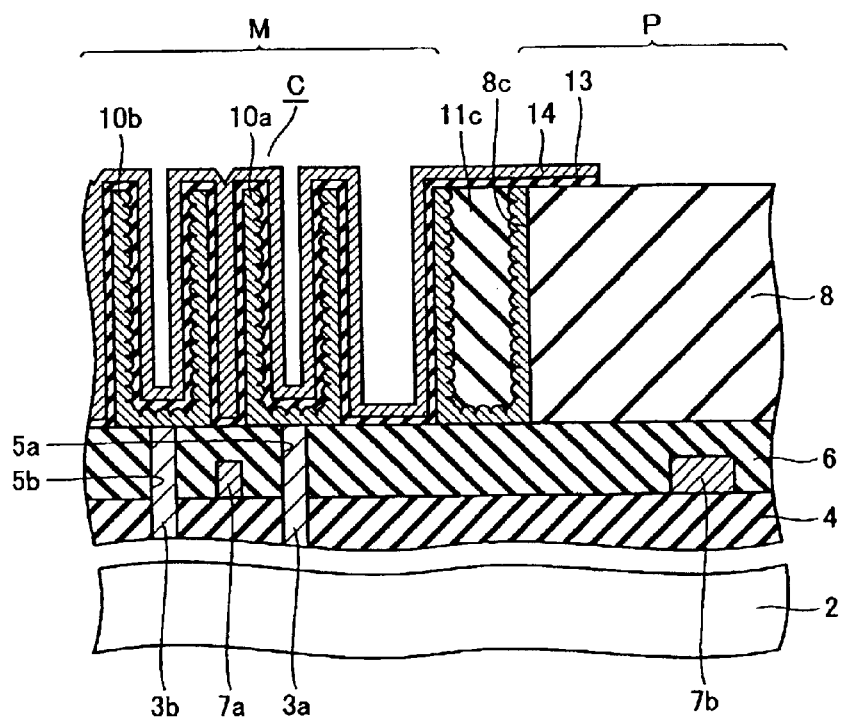
FIG. 6 is a section view showing the step subsequent to the step shown in FIG. 5 in the first embodiment.

The polysilicon film and the dielectric film are anisotropically etched using the photoresist pattern as a mask, to form a capacitor dielectric film 13 and a cell plate 14, as shown in FIG. 6.

Figure 7:
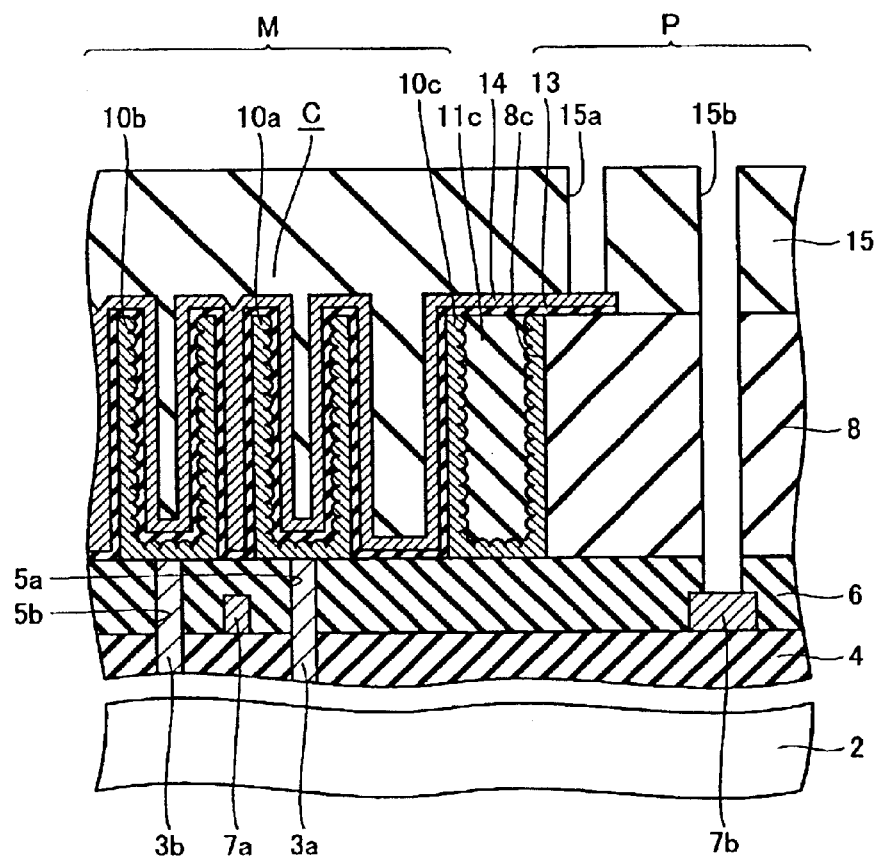
FIG. 7 is a section view showing the step subsequent to the step shown in FIG. 6 in the first embodiment.

Storage node 10a or 10b, capacitor dielectric film 13 and cell plate 14 constitute capacitor C. Next, as shown in FIG. 7, an interlayer insulation film 15 made of a TEOS film is formed on interlayer film 8 so as to cover capacitor C by e.g. the CVD technique. Subsequently, a prescribed photoresist pattern (not shown) is formed on interlayer insulation film 15.

Interlayer insulation film 15 and interlayer film 8 are anisotropically etched using the photoresist pattern as a mask, to form contact hole 15a that exposes the surface of cell plate 14 and a contact hole 15b that exposes the surface of bit line 7b.

Thereafter, a prescribed plug (not shown) is formed in each of contact holes 15a, 15b. Next, a prescribed interconnection (not shown) electrically connected to the plug is formed on interlayer insulation film 15. Thus, a DRAM is completed.

In the DRAM described above, the TEOS film is formed such that it is embedded in openings 8a, 8b at removal of rough polysilicon film 10 located on the upper surface of interlayer film 8. Thereafter, as shown in FIG. 3, the CMP process is performed on the TEOS film to form TEOS films 11a, 11b.

Embedded TEOS films 19a, 19b left in openings 8a, 8b are removed concurrently with interlayer film 8 located in memory cell region M by wet etching, as shown in FIG. 4, so that cylindrical storage nodes 10a, 10b are formed.

Accordingly, compared to the conventional example where embedded photoresists 119a, 119b are left in openings 108a, 108b, storage nodes 10a, 10b can be formed without the step of removing such embedded photoresist 119a, 119b performed separately from removal of interlayer film 108 located in memory cell region M.

Further, by using the CMP process to remove rough polysilicon film 10 located on the upper surface of interlayer film 8, polysilicon grains of rough polysilicon film are less sputtered compared to the conventional way of removal by dry etching using an electron beam.

This can prevent electrical short circuit associated with sputtering of the polysilicon grains, suppressing reduction in yield of the DRAM.

As such, by using the CMP process to remove rough polysilicon film 10 located on the upper surface of interlayer film 8, the opening end of groove 8c, the upper surface of embedded TEOS film 11c and the upper surface of interlayer film 8 are located on substantially the same plane.

Moreover, when storage nodes 10a, 10b are formed, interlayer film 8 located in peripheral circuit region P is covered by photoresist pattern 12a so as not to be removed. Then, as shown in FIG. 7, capacitor C is formed in memory cell region M, while interlayer insulation film 15 is formed in peripheral circuit region P with interlayer film 8 left.

Here, the upper end of capacitor C is located at substantially the same level as the upper surface of interlayer insulation film 15, so that no step is generated between memory cell region M and peripheral circuit region P unlike the conventional DRAM, interlayer insulation film 15 being substantially flat over the entire surface of the semiconductor substrate.

This can ensure accuracy of photolithography in forming contact holes 15a, 15b and the like, allowing contact holes 15a, 15b and the like to be formed with improved accuracy in dimension. Moreover, accuracy of photolithography is also secured in forming a prescribed interconnection on interlayer insulation film 15, so that an interconnection with improved dimension accuracy can be formed.

Second Embodiment

Figure 8:
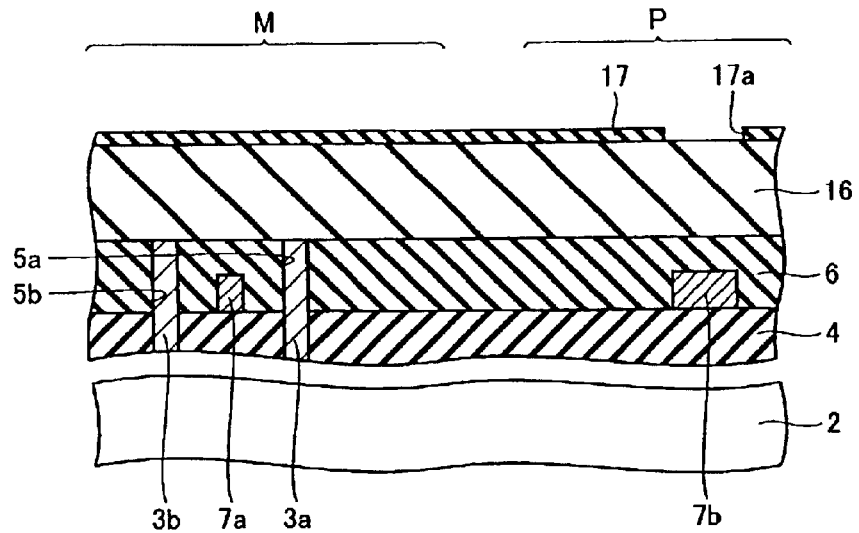
FIG. 8 is a section view showing one step of a method of manufacturing a semiconductor device according to the second embodiment of the present invention.

A method of manufacturing a DRAM including a cylindrical capacitor according to the second embodiment of the present invention will be described. First, after silicon oxide film 6 is formed at the step shown in FIG. 1 described earlier, a silicon oxide film 16 is formed by e.g. the CVD technique as shown in FIG. 8.

A silicon nitride film 17 having an etching characteristic different from that of a silicon oxide film is formed on silicon oxide film 16. Prescribed photolithography and etching are performed on silicon nitride film 17, so that an opening 17a that exposes the surface of silicon oxide film 16 is formed in peripheral circuit region P.

Figure 9:
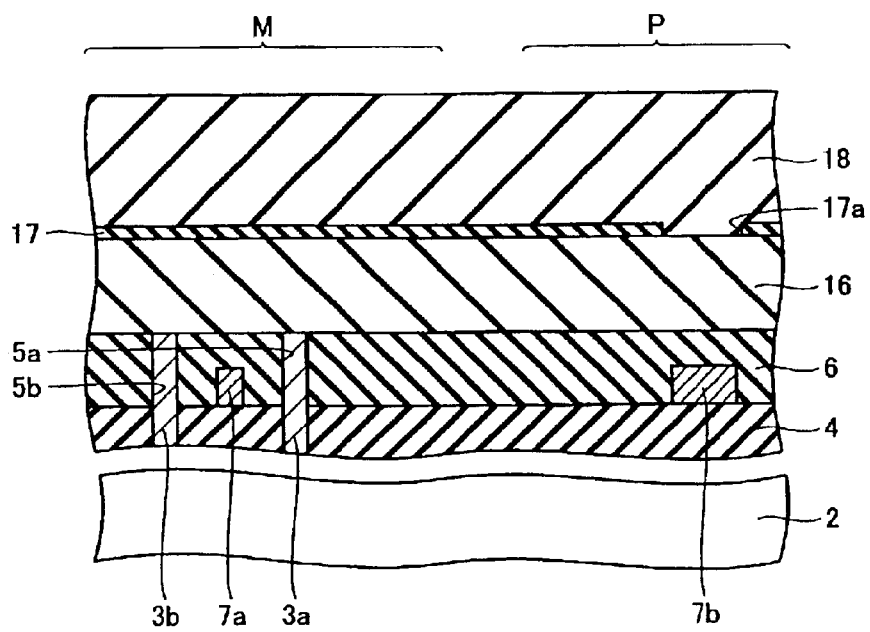
FIG. 9 is a section view showing the step subsequent to the step shown in FIG. 8 in the second embodiment.

Next, as shown in FIG. 9, a silicon oxide film 18 is formed on silicon nitride film 17 by e.g. the CVD technique. A prescribed photoresist pattern (not shown) is formed on silicon oxide film 18.

Figure 10:
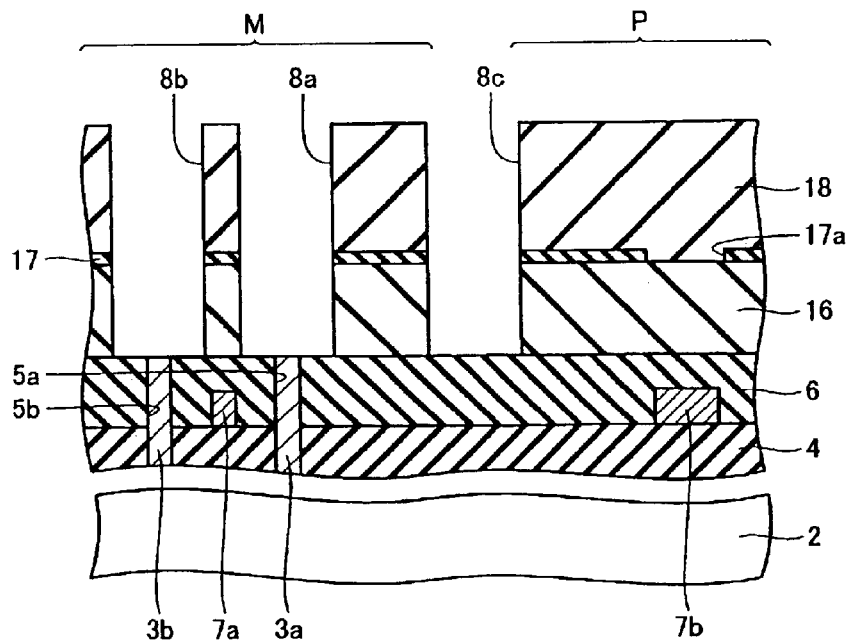
FIG. 10 is a section view showing the step subsequent to the step shown in FIG. 9 in the second embodiment.

Silicon oxide films 18, 16 and silicon nitride film 17 are anisotropically etched using the photoresist pattern as a mask, to form openings 8a, 8b that expose the surfaces of plugs 3a, 3b, respectively, as shown in FIG. 10. Further, groove 8c is formed surrounding memory cell region M.

Figure 11:
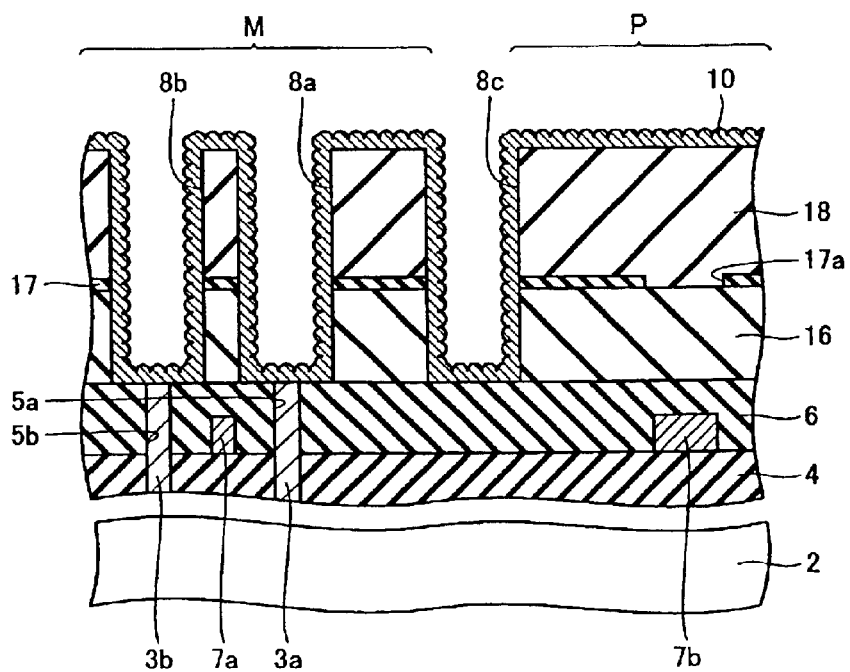
FIG. 11 is a section view showing the step subsequent to the step shown in FIG. 10 in the second embodiment.

Next, a process similar to the step shown in FIG. 2 described earlier is performed to form rough polysilicon film 10 on silicon oxide film 18 and on the inner surfaces of openings 8a, 8b and groove 8c, as shown in FIG. 11.

Figure 12:
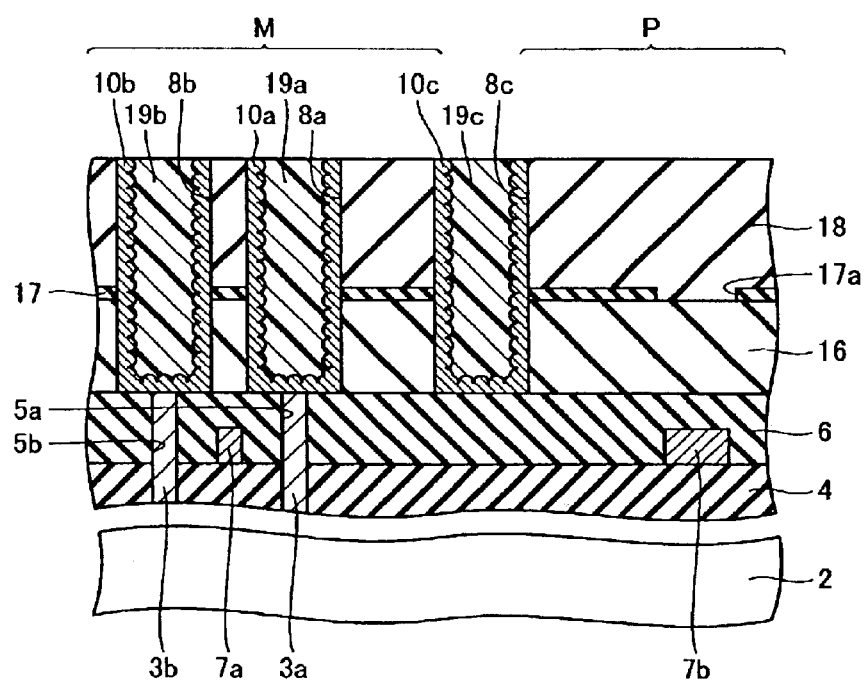
FIG. 12 is a section view showing the step subsequent to the step shown in FIG. 11 in the second embodiment.

Subsequently, embedded photoresists 19a, 19b and 19c are formed within openings 8a, 8b and groove 8c, respectively. Thereafter, as shown in FIG. 12, the CMP technique is performed to remove rough polysilicon film 10 located on the upper surface of silicon oxide film 18.

Figure 13:
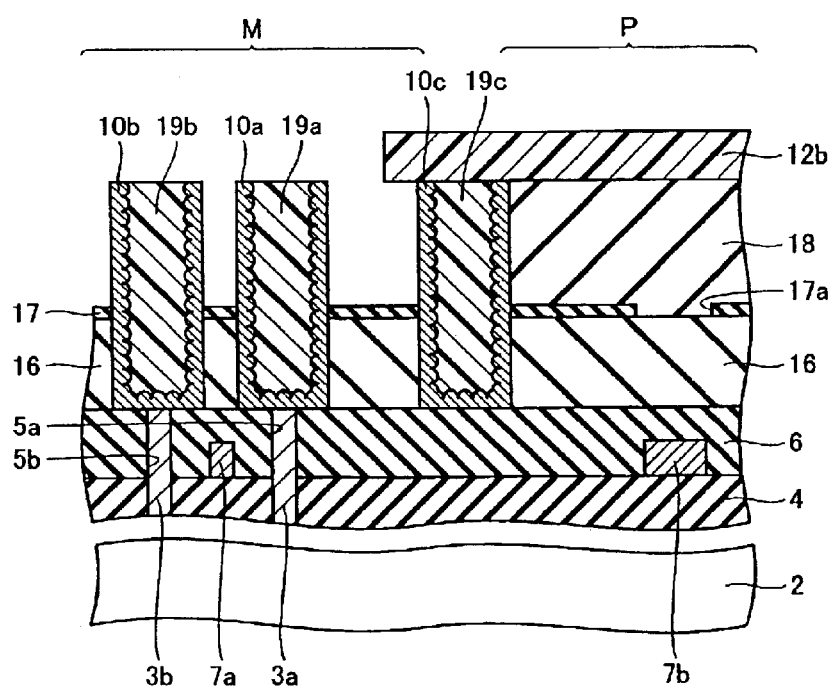
FIG. 13 is a section view showing the step subsequent to the step shown in FIG. 12 in the second embodiment.

Next, as shown in FIG. 13, photoresist pattern 12b is formed so as to cover embedded photoresist 19c and silicon oxide film 18 located in peripheral circuit region P.

Wet etching by e.g. buffered hydrofluoric acid is performed using photoresist pattern 12b as a mask, to remove silicon oxide film 18 located in memory cell region M.

Here, when silicon oxide film 18 is removed and silicon nitride film 17 is exposed, etching is blocked there. Thus, substantially a lower half of a sidewall portion adjacent to a part that is to be a storage node is filled with silicon oxide film 16.

Subsequently, photoresist pattern 12b and embedded photoresists 19a, 19b are removed. Thus, cylindrical storage nodes 10a, 10b are formed in memory cell region M.

Figure 14:
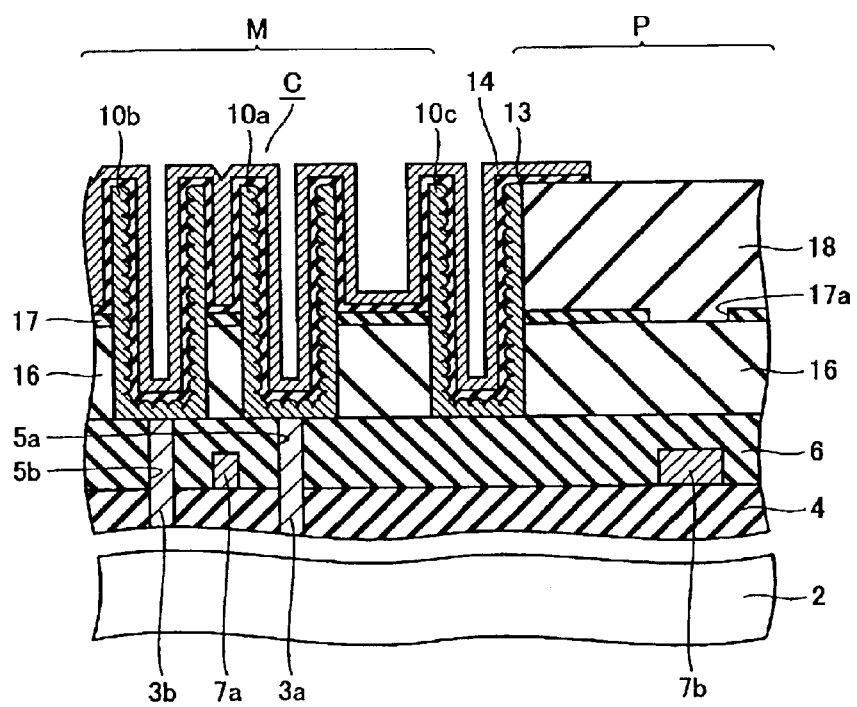
FIG. 14 is a section view showing the step subsequent to the step shown in FIG. 13 in the second embodiment.

Next, a process similar to the step shown in FIG. 6 described earlier is performed to form capacitor C including storage nodes 10a or 10b, capacitor dielectric film 13 and cell plate 14, as shown in FIG. 14.

Figure 15:
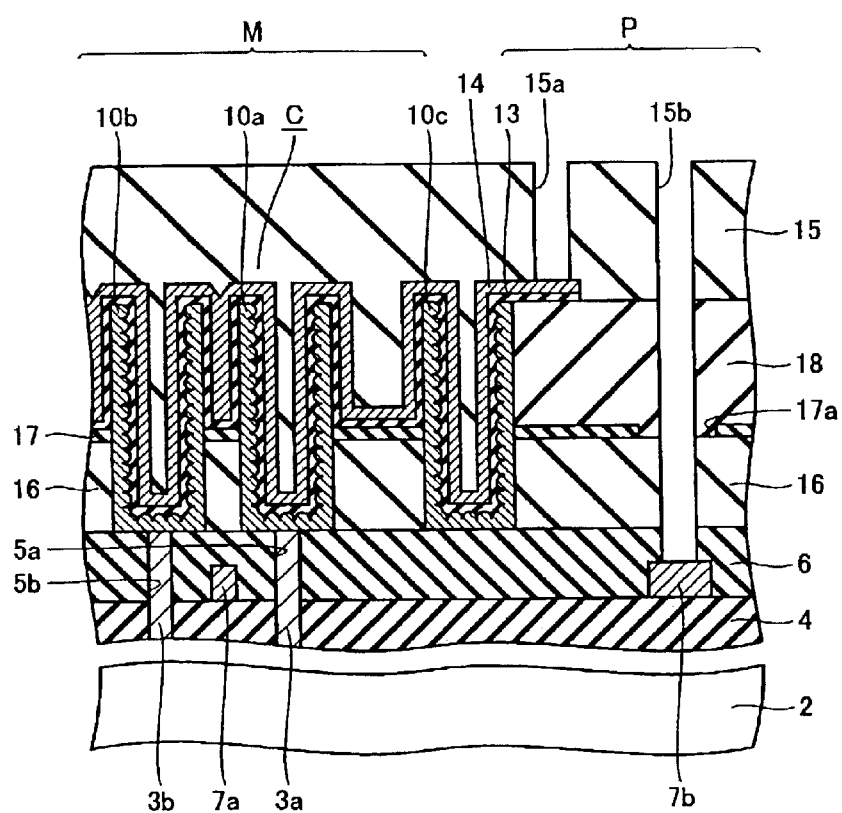
FIG. 15 is a section view showing the step subsequent to the step shown in FIG. 14 in the second embodiment.

Next, a process similar to the step shown in FIG. 7 described earlier is performed to form interlayer insulation film 15 covering capacitor C, and contact hole 15a that exposes the surface of cell plate 14 and contact hole 15b that exposes the surface of bit line 7b are formed at interlayer insulation film 15 and the like, as shown in FIG. 15.

A prescribed plug (not shown) is formed in each of contact holes 15a, 15b. A prescribed interconnection (not shown) electrically connected to the plug is formed on interlayer insulation film 15. This completes the DRAM.

According to the DRAM described above, the following effects are obtained. In the above-described DRAM, first, silicon nitride film 17 having an etching characteristic different from that of a silicon oxide film is formed between silicon oxide film 16 and silicon oxide film 18.

Thus, when silicon oxide film 18 located in memory cell region M is removed by wet etching, the wet etching is blocked at the point where silicon nitride film 17 is exposed. Accordingly, substantially a lower half of a sidewall portion adjacent to capacitor (storage node) C is filled with silicon oxide film 16. As a result, capacitor C can be prevented from falling on silicon oxide film 6, suppressing electrical short circuit between memory cells (between bits) occurring due to fall of capacitor C, preventing reduction in the product yield.

Moreover, as shown in FIG. 8, at silicon nitride film 17 located in peripheral circuit region P, a portion in which contact hole 15b and the like are formed is removed in advance. This eliminates the need for etching performed on silicon nitride film 17 having an etching characteristic different from that of silicon oxide films 16, 18 at forming contact hole 15b and the like, facilitating etching and working control.

In addition, as in the DRAM described earlier, the CMP process is used to remove rough polysilicon film 10 located on the upper surface of interlayer film 8, so that electrical short circuit associated with sputtering of polysilicon grains can be prevented, suppressing reduction in the yield of the DRAM.

Furthermore, no step is produced between memory cell region M and peripheral circuit region P, so that interlayer insulation film 15 is substantially flat over the entire surface of the semiconductor substrate, improving accuracy of photolithography performed in a subsequent process.

Third Embodiment

Figure 16:
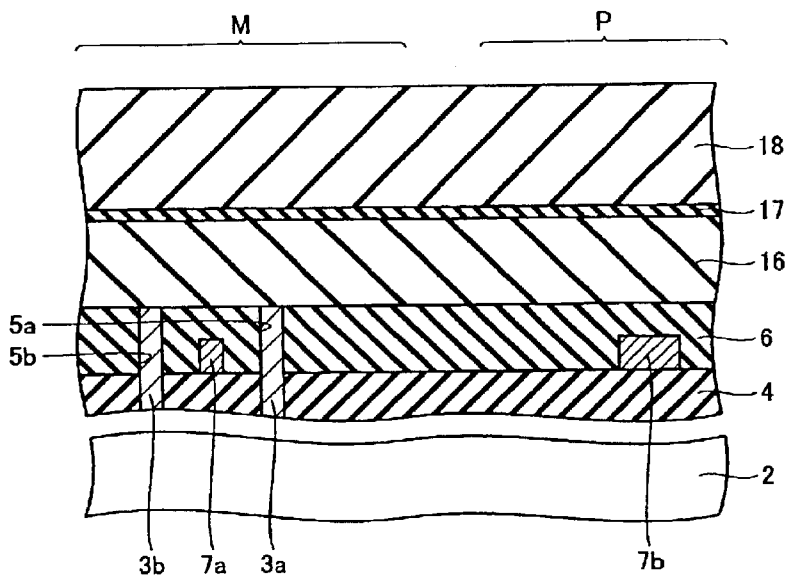
FIG. 16 is a section view showing one step of a method of manufacturing a semiconductor device according to the third embodiment of the present invention.

A method of manufacturing a DRAM including a cylindrical capacitor according to the third embodiment of the present invention will be described. First, after silicon oxide film 6 is formed at the step shown in FIG. 1 described earlier, silicon oxide film 16 is formed by e.g. the CVD technique, as shown in FIG. 16.

Silicon nitride film 17 having an etching characteristic different from that of a silicon oxide film is formed on silicon oxide film 16. Silicon oxide film 18 is formed on silicon nitride film 17 by e.g. the CVD technique. A prescribed photoresist pattern (not shown) is formed on silicon oxide film 18.

Figure 17:
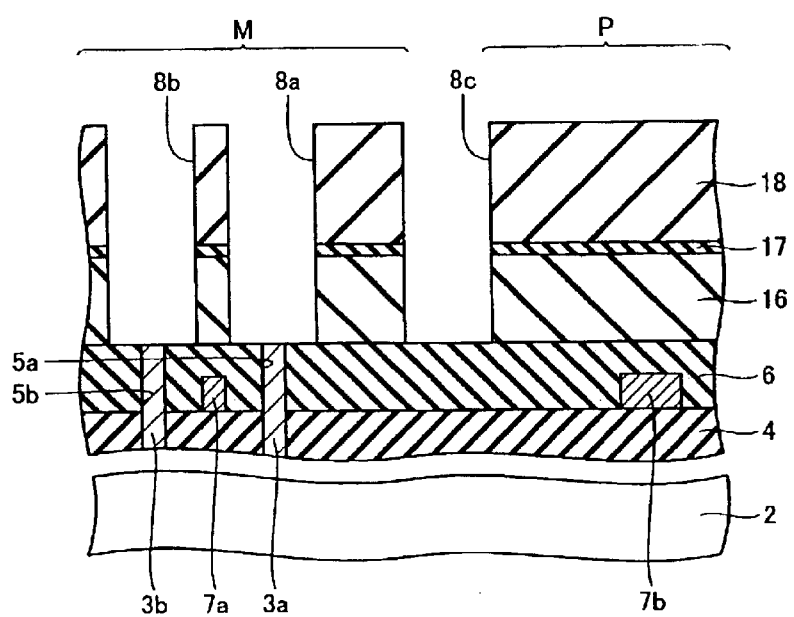
FIG. 17 is a section view showing the step subsequent to the step shown in FIG. 16 in the third embodiment.

Silicon oxide films 18, 16 and silicon nitride film 17 are anisotropically etched using the photoresist pattern as a mask, to form openings 8a, 8b that expose the surfaces of plugs 3a, 3b, respectively, as shown in FIG. 17. Moreover, groove 8c surrounding memory cell region M is formed.

Figure 18:
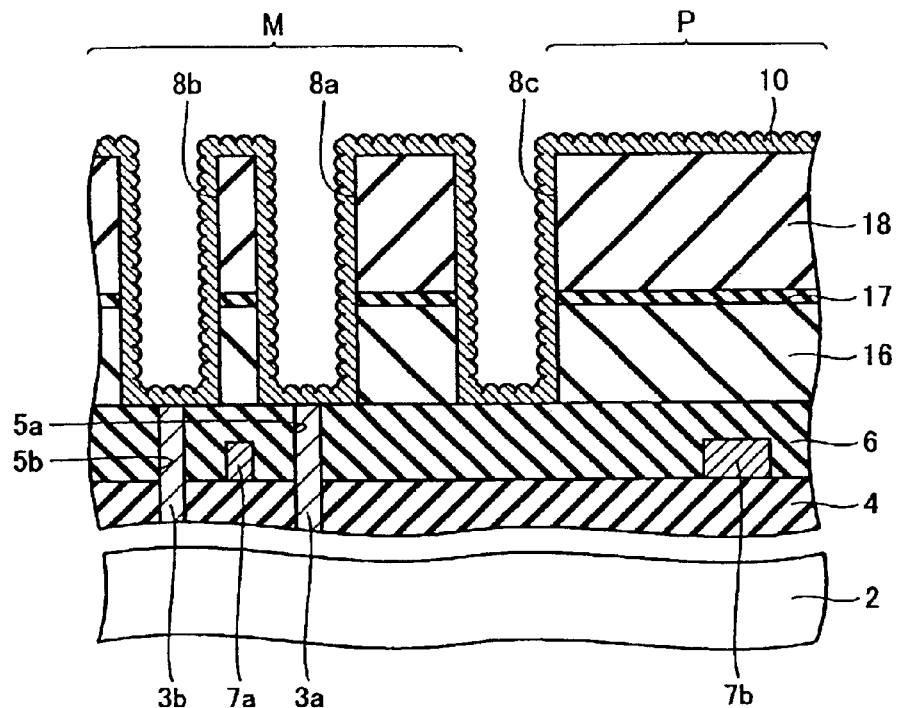
FIG. 18 is a section view showing the step subsequent to the step shown in FIG. 17 in the third embodiment.

Next, a process similar to the step shown in FIG. 2 as described earlier is performed to form rough polysilicon film 10 on silicon oxide film 18 and on the inner surfaces of openings 8a, 8b and groove 8c, as shown in FIG. 18.

Figure 19:
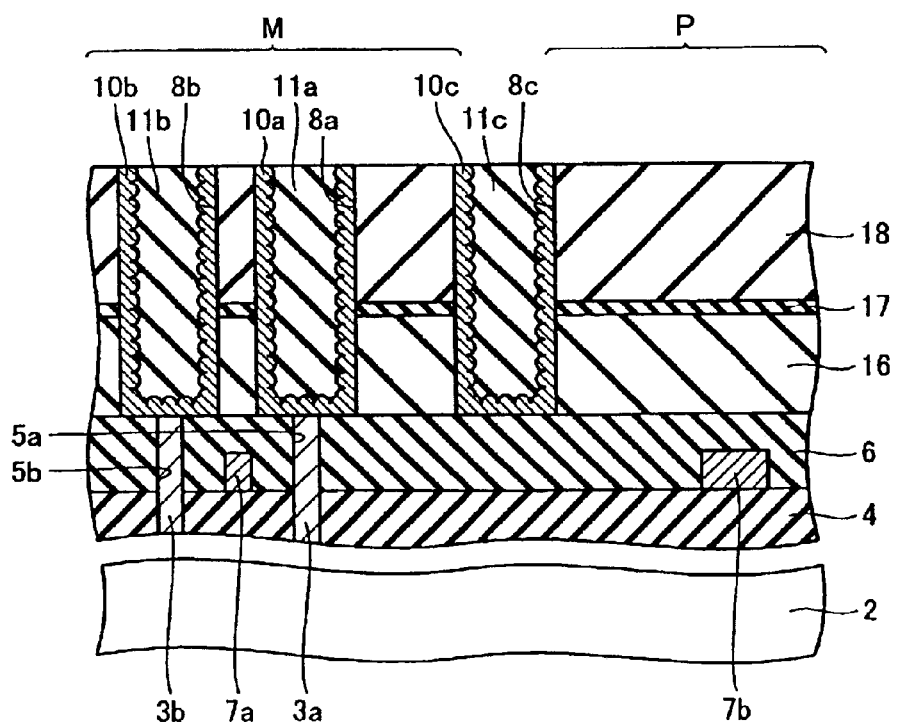
FIG. 19 is a section view showing the step subsequent to the step shown in FIG. 18 in the third embodiment.
Figure 20:
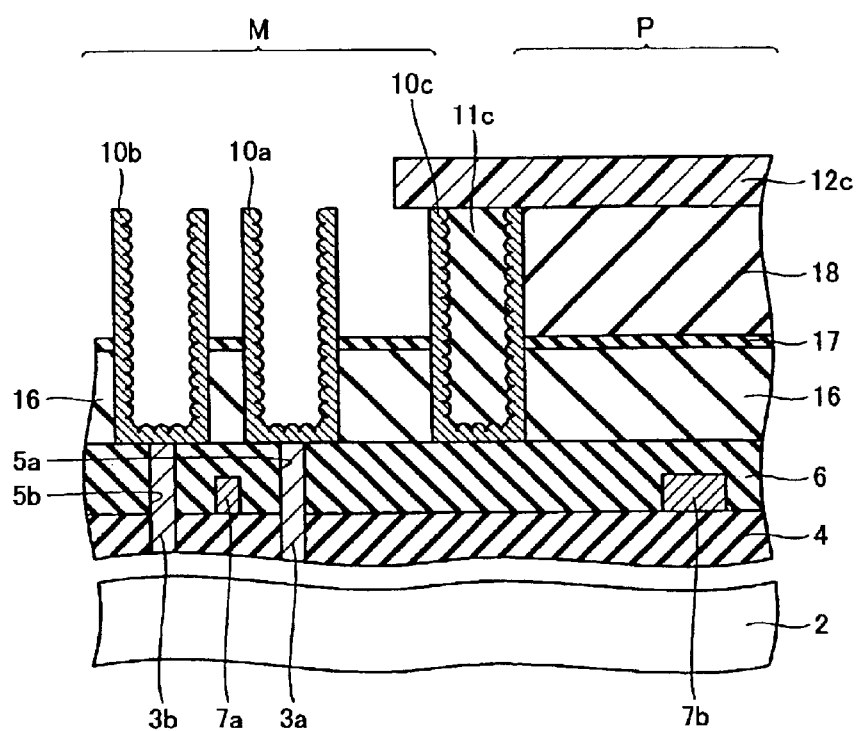
FIG. 20 is a section view showing the step subsequent to the step shown in FIG. 19 in the third embodiment.

Next, a TEOS film (not shown) is formed on silicon oxide film 18 and on the inner surfaces of openings 8a, 8b and groove 8c. The CMP process is performed on the TEOS film to remove the TEOS film and rough polysilicon film located on the upper surface of silicon oxide film 18, so that embedded TEOS films 11a, 11b and 11c are formed in openings 8a, 8b and groove 8c, respectively, as shown in FIG. 19.

Next, photoresist pattern 12c is formed so as to cover embedded TEOS film 11c and silicon oxide film 18 located in peripheral circuit region P.

Wet etching by e.g. buffered hydrofluoric acid is performed using photoresist pattern 12c as a mask, to remove embedded TEOS films 11a, 11b and silicon oxide film 18 located in memory cell region M. Subsequently, photoresist pattern 12c is removed. Accordingly, tubular storage nodes 10a, 10b are formed.

Figure 21:
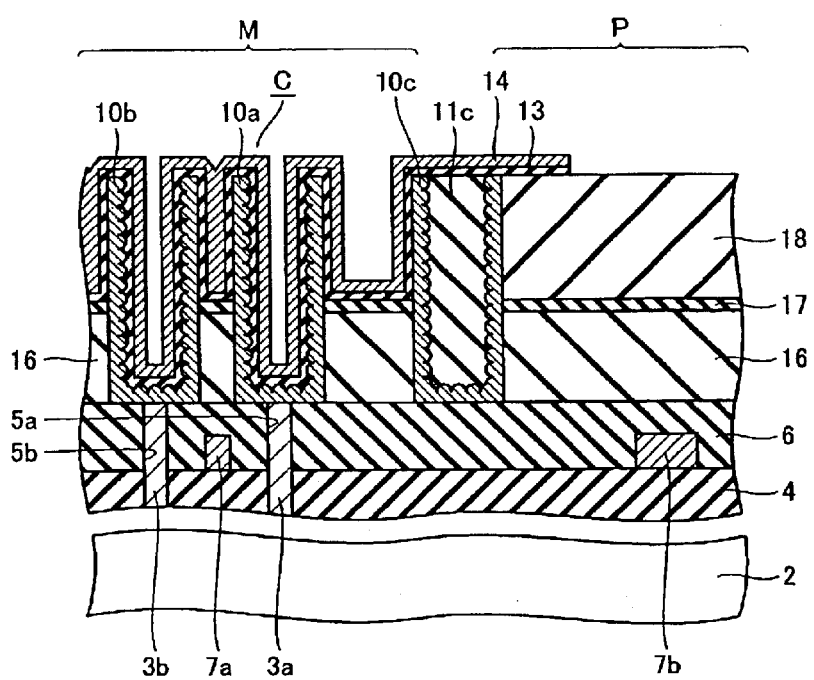
FIG. 21 is a section view showing the step subsequent to the step shown in FIG. 20 in the third embodiment.

Next, a process similar to the step shown in FIG. 6 as described earlier is performed to form capacitor C including storage node 10*a* or 10*b*, capacitor dielectric film 13 and cell plate 14, as shown in FIG. 21.

Figure 22:
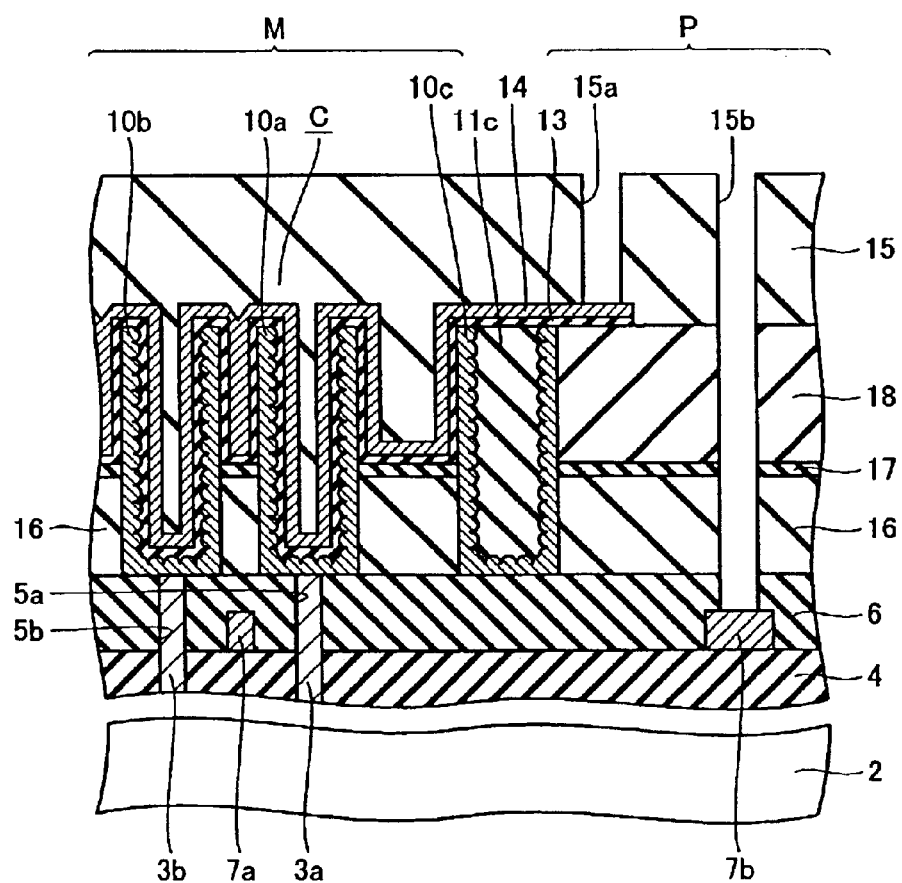
FIG. 22 is a section view showing the step subsequent to the step shown in FIG. 21 in the third embodiment.

Next, a process similar to the step shown in FIG. 7 as described earlier is performed to form interlayer insulation film 15, and to form contact holes 15*a* that exposes the surface of cell plate 14 and contact hole 15*b* that exposes the surface of bit line 7*b* at interlayer insulation film 15 and the like, as shown in FIG. 22.

A prescribed plug (not shown) is formed in each of contact holes 15*a*, 15*b*. A prescribed interconnection (not shown) electrically connected to the plug is formed on interlayer insulation film 15, to complete the DRAM.

According to the DRAM as described above, the effects obtained for the two semiconductor devices described earlier can be obtained. In the above-described DRAM, silicon nitride film 17 having an etching characteristic different from that of a silicon oxide film is formed between silicon oxide film 16 and silicon oxide film 18. Thus, at removal of silicon oxide film 18, wet etching is blocked at the point where silicon nitride film 17 is exposed, so that substantially a lower half of a sidewall portion adjacent to capacitor (storage node) C is filled with silicon oxide film 16. As a result, capacitor C can be prevented from falling on silicon oxide film 6.

Moreover, the TEOS film is formed such that it is embedded in openings 8*a*, 8*b* at removal of rough polysilicon film 10 located on the upper surface of interlayer film 8. Thus, compared to the conventional example where embedded photoresists 119*a*, 119*b* are left within openings 108*a*, 108*b*, storage nodes 10*a*, 10*b* can be formed without the need for the step of removing such embedded photoresists 119*a*, 119*b* performed separately from removal of interlayer film 108 located in memory cell region M.

In addition, the CMP process is used to remove rough polysilicon film 10 located on the upper surface of interlayer film 8, so that electrical short circuit associated with sputtering of polysilicon grains is prevented, suppressing reduction in the yield of the DRAM.

Furthermore, no step is produced at interlayer insulation film 15 between memory cell region M and peripheral circuit region P, so that interlayer insulation film 15 is substantially flat over the entire surface of the semiconductor substrate, improving the accuracy of photolithography performed in a subsequent process.

Fourth Embodiment

Figure 23:
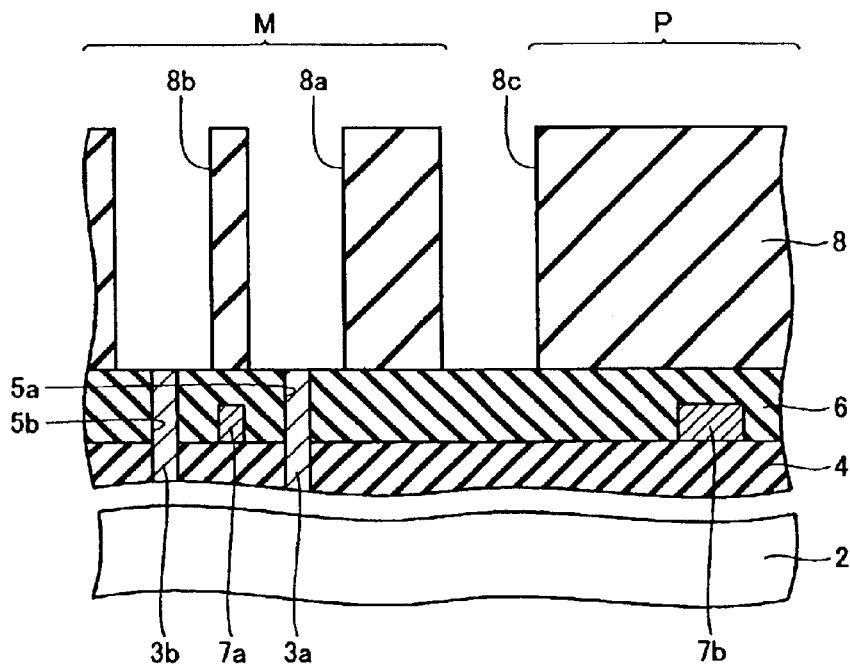
FIG. 23 is a section view showing one step of a method of manufacturing a semiconductor device according to the fourth embodiment of the present invention.

A method of manufacturing a DRAM including a cylindrical capacitor according to the fourth embodiment of the present invention will be described. Up to the step shown in FIG. 23, a process similar to that up to the step shown in FIG. 1 described earlier is performed.

Figure 24:
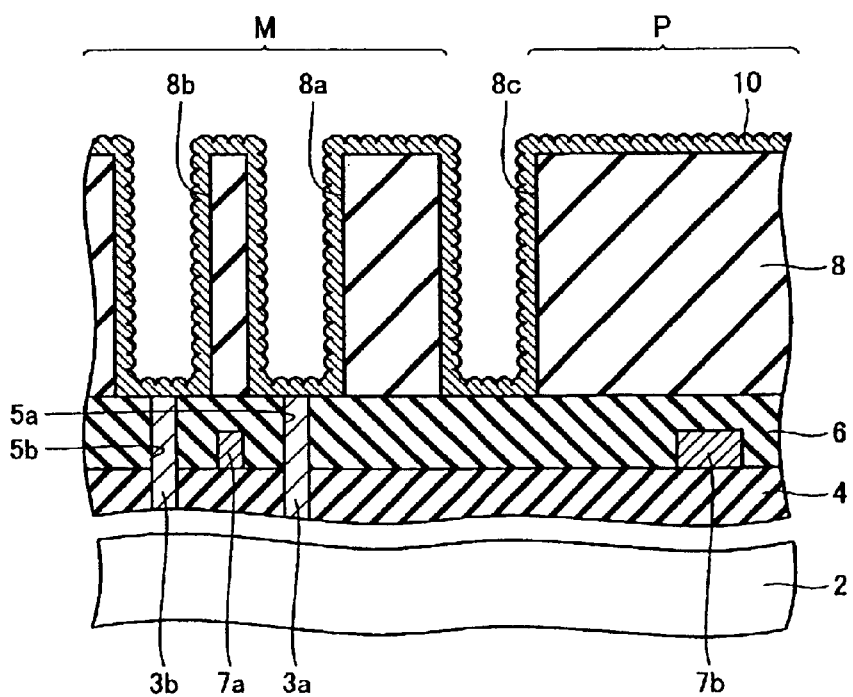
FIG. 24 is a section view showing the step subsequent to the step shown in FIG. 23 in the fourth embodiment.

Next, a process similar to the step shown in FIG. 2 described earlier is performed to form rough polysilicon film 10 on interlayer film 8 and on the inner surfaces of openings 8*a*, 8*b* and groove 8*c*, as shown in FIG. 24.

Figure 25:
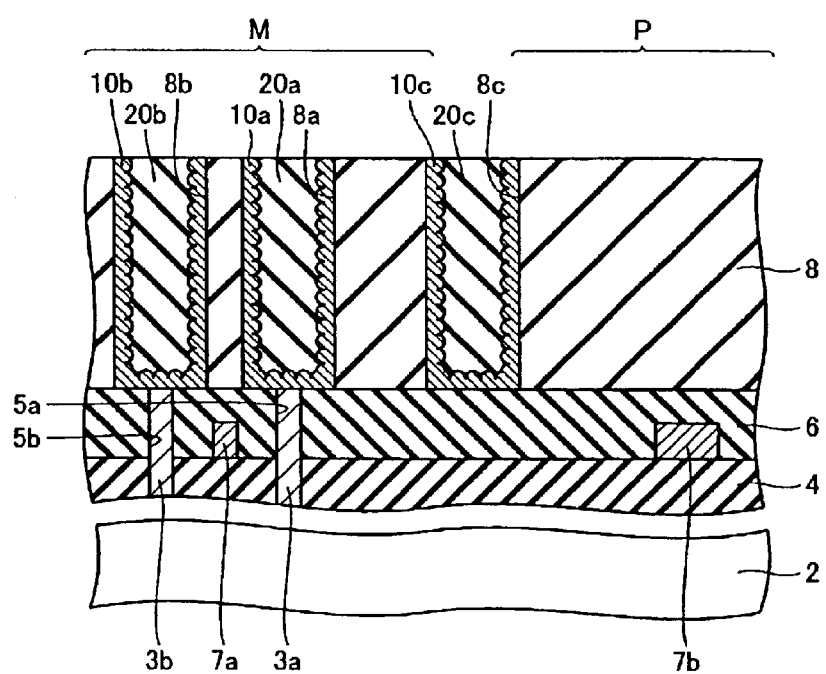
FIG. 25 is a section view showing the step subsequent to the step shown in FIG. 24 in the fourth embodiment.

Next, a TEOS film (not shown) having an etching characteristic different from that of interlayer film 8 is formed on interlayer film 8 and on the inner surfaces of openings 8*a*, 8*b* and groove 8*c*. The CMP process is performed on the TEOS film to remove rough polysilicon film 10 and the TEOS film located on the upper surface of interlayer film 8, so that embedded TEOS films 20*a*, 20*b* are formed within openings 8*a*, 8*b*, as shown in FIG. 25. Moreover, embedded TEOS film 20*c* is formed within groove 8*c*.

Figure 26:
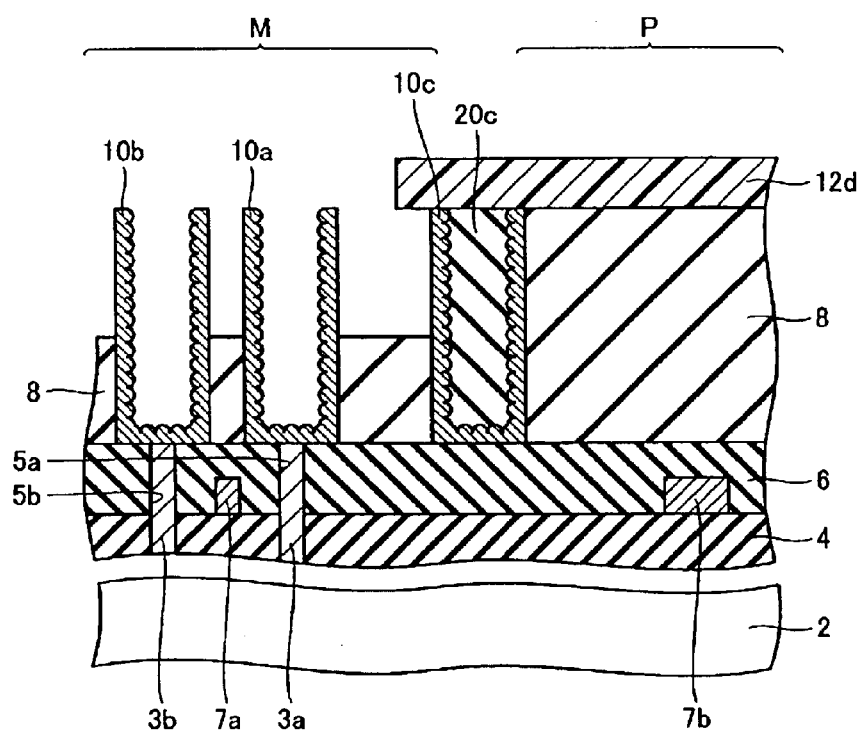
FIG. 26 is a section view showing the step subsequent to the step shown in FIG. 25 in the fourth embodiment.

Next, as shown in FIG. 26, photoresist pattern 12*d* is formed so as to cover embedded TEOS film 20*c* and interlayer film 8 located in peripheral circuit region P. Photoresist pattern 12*d* is used as a mask to perform wet etching on embedded TEOS films 20*a*, 20*b* and interlayer film 8 located in memory cell region M by e.g. buffered hydrofluoric acid.

Here, interlayer film 8 has an etching characteristic different from that of embedded TEOS films 20*a*, 20*b*, so that a part of interlayer film 8 is left if etching is stopped after: embedded TEOS films 20*a*, 20*b* are removed. Thus, a lower part of the portion to be a storage node is filled with interlayer film 8.

Subsequently, photoresist pattern 12*d* is removed. Thus, tubular storage nodes 10*a*, 10*b* are formed in memory cell region M.

Figure 27:
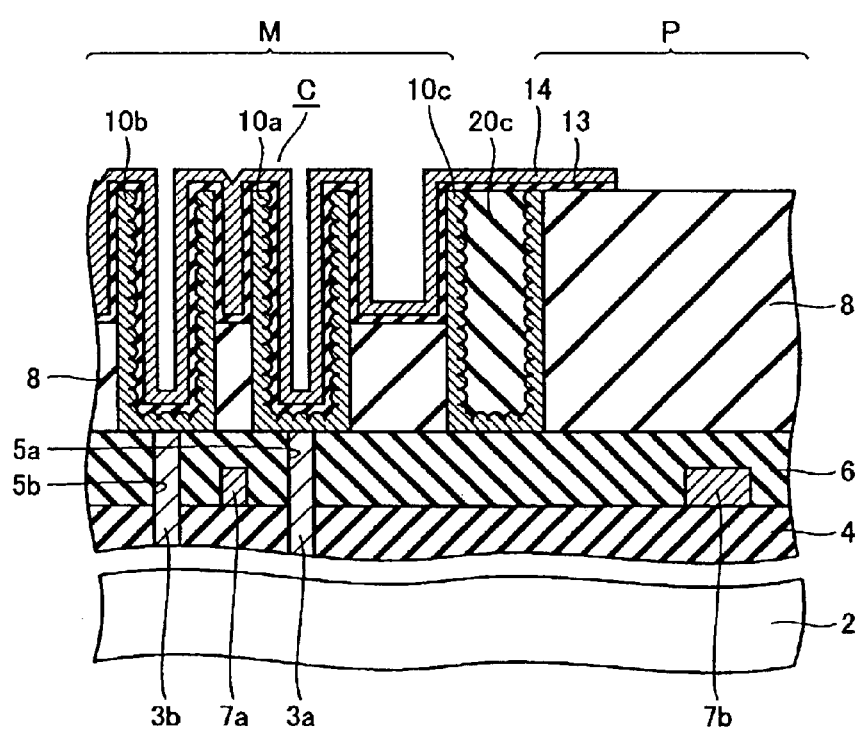
FIG. 27 is a section view showing the step subsequent to the step shown in FIG. 26 in the fourth embodiment.

Next, a process similar to the step shown in FIG. 6 described earlier is performed to form capacitor C including storage node 10*a* or 10*b*, capacitor dielectric film 13 and cell plate 14, as shown in FIG. 27.

Figure 28:
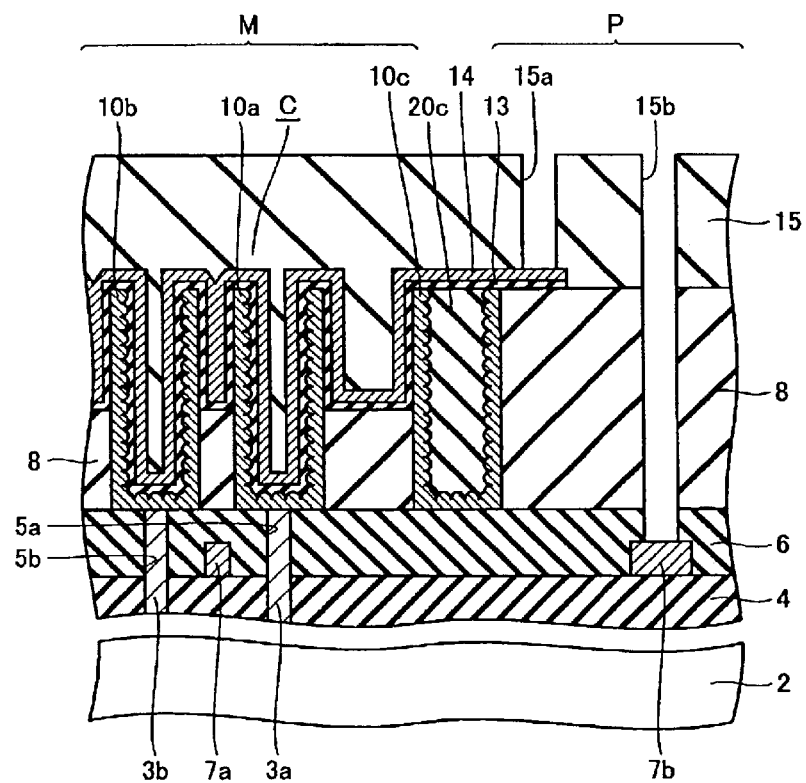
FIG. 28 is a section view showing the step subsequent to the step shown in FIG. 27 in the fourth embodiment.
Figure 29:
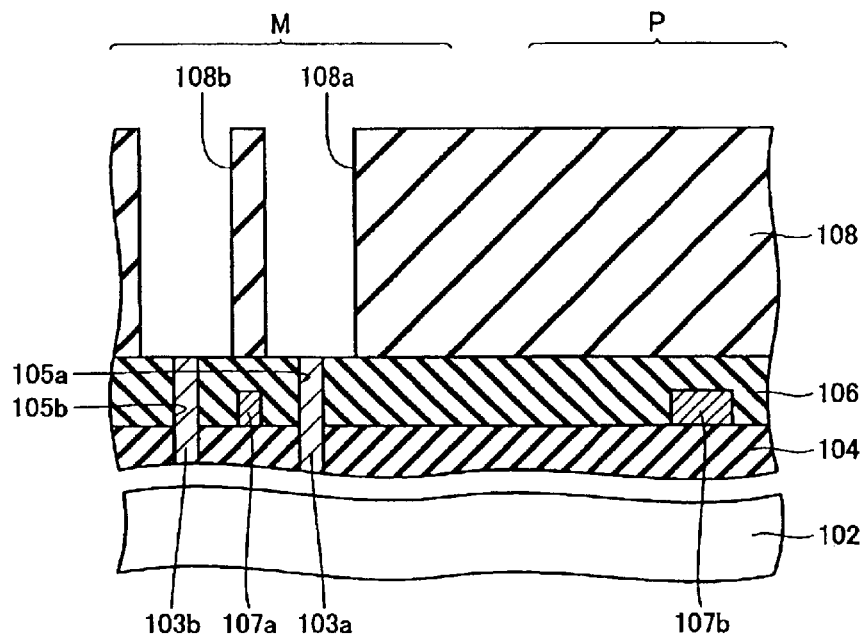
FIG. 29 is a section view showing one step of the conventional method of manufacturing a semiconductor device.
Figure 30:
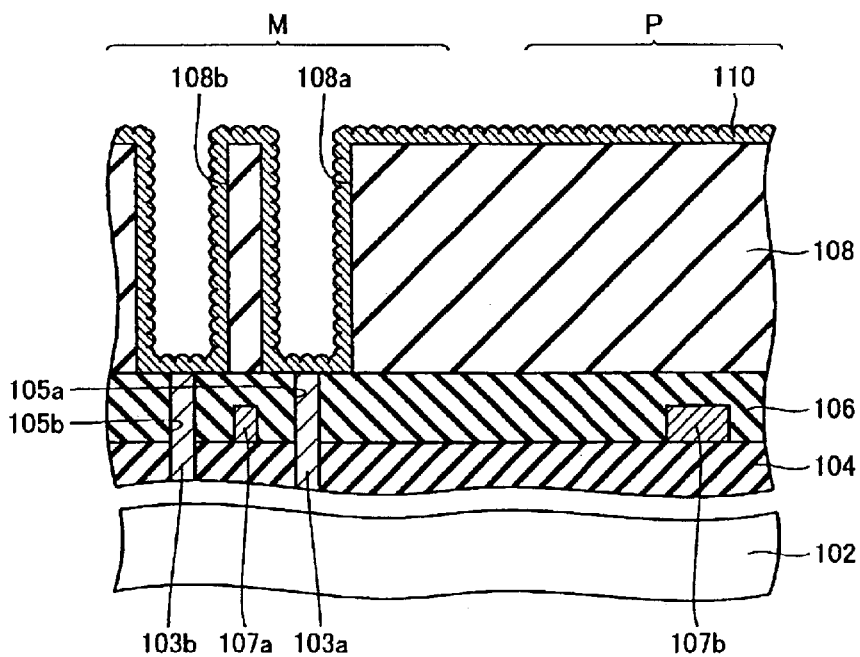
FIG. 30 is a section view showing the step subsequent to the step shown in FIG. 29.
Figure 31:
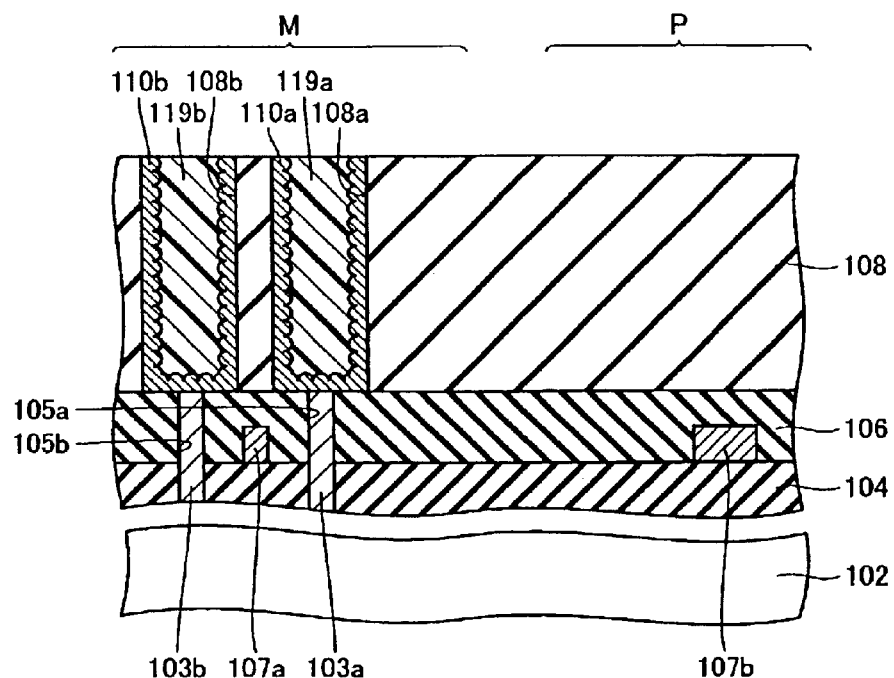
FIG. 31 is a section view showing the step subsequent to the step shown in FIG. 30.
Figure 32:
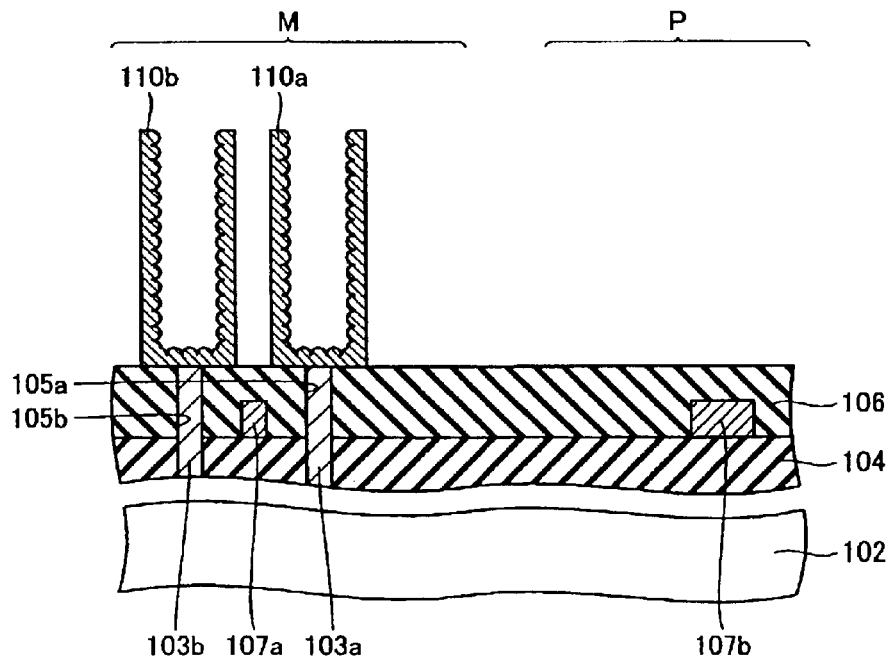
FIG. 32 is a section view showing the step subsequent to the step shown in FIG. 31.
Figure 33:
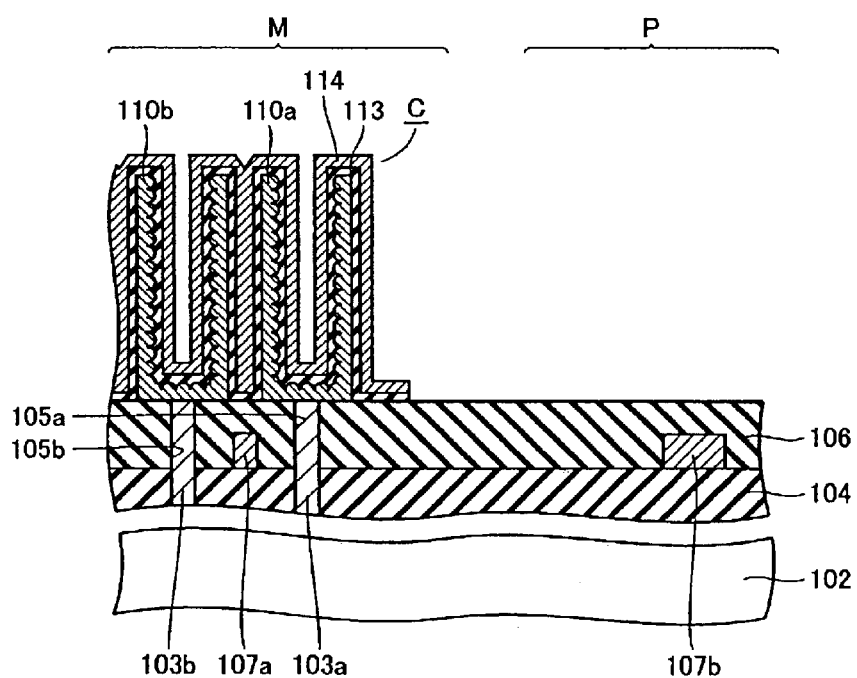
FIG. 33 is a section view showing the step subsequent to the step shown in FIG. 32.
Figure 34:
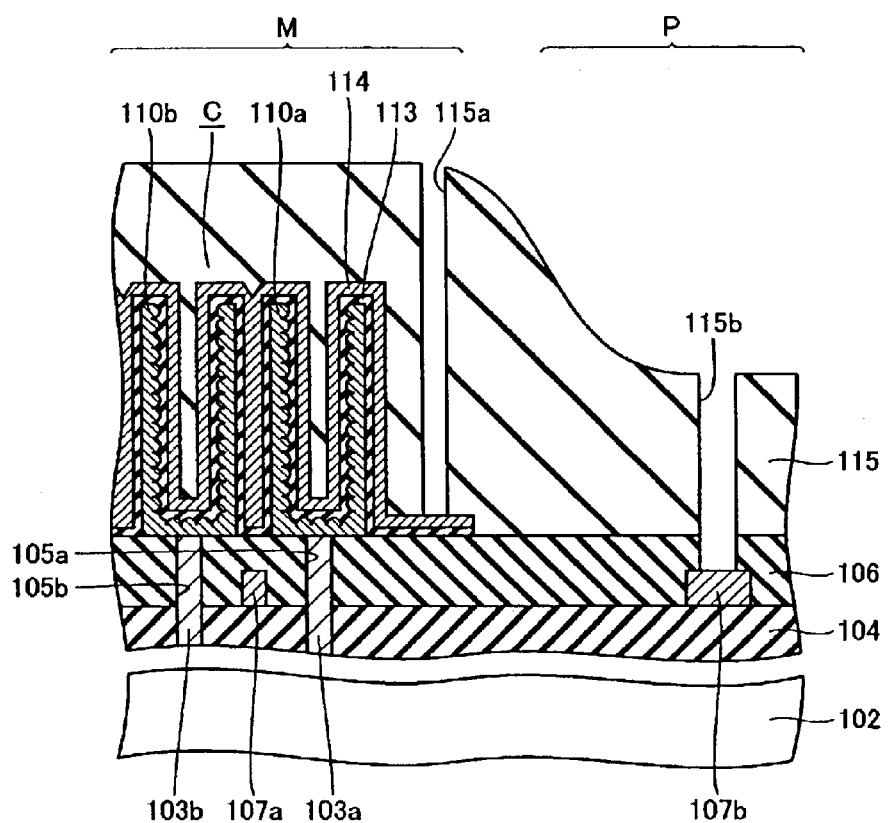
FIG. 34 is a section view showing the step subsequent to the step shown in FIG. 33.

Next, a process similar to the step shown in FIG. 7 described earlier is performed to form interlayer insulation film 15 covering capacitor C, and to form contact hole 15*a* that exposes the surface of cell plate 14 and contact hole 15*b* that exposes the surface of bit line 7*b* at interlayer insulation film 15 and the like, as shown in FIG. 28.

A prescribed plug (not shown) is formed in each of contact holes 15*a*, 15*b*. A prescribed interconnection (not shown) electrically connected to the plug is formed on interlayer insulation film 15, to complete the DRAM.

According to the DRAM described above, the following effects are obtained. First, in the above-described DRAM, embedded TEOS films 20*a*, 20*b* having an etching characteristic different from that of interlayer film 8 are formed within openings 8*a*, 8*b*.

Thus, at removal of interlayer film 8 located in memory cell region M by wet etching, if the etching is stopped after embedded TEOS films 20*a*, 20*b* are removed, a part of interlayer film 8 remains. Since interlayer film 8 thus remains, no additional film having a different etching characteristic such as a silicon nitride film is required to serve as interlayer film 8.

Accordingly, the lower part of the portion to be a storage node is filled with interlayer film 8, preventing capacitor C from falling on silicon oxide film 6.

In addition, the CMP process is used to remove rough polysilicon film 10 located on the upper surface of interlayer film 8, so that electrical short circuit associated with sputtering of polysilicon gains is prevented, suppressing reduction in the yield of the DRAM.

Moreover, no step is produced at interlayer insulation film 15 between memory cell region M and peripheral circuit region P, allowing interlayer insulation film 15 to be substantially flat over the entire surface of the semiconductor substrate, improving the accuracy of photolithography performed in a subsequent process.

While the second and third embodiments above described a combination of silicon oxide films 16, 18 and silicon nitride film 17 as films having different etching characteristics by way of example, any structure in which a film having a lower etching rate is formed at a layer in the midstream of a film having openings 8*a*, 8*b* may be adopted, not limited to the film types above.

Further, while the fourth embodiment described interlayer film 8 as a film in which openings 8*a*, 8*b* are formed and embedded TEOS film as a film to be embedded in openings 8*a*, 8*b* by way of example, it is not limited to the film types described above, but any film types may be employed in which a film for openings 8a, 8b is left after a film embedded in openings 8a, 8b are removed by etching.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a first element-forming region and a second element-forming region on a main surface of a semiconductor substrate;

forming a first insulation film in said first element-forming region and said second element-forming region, wherein said step of forming said first insulation film includes the steps of forming a first layer, forming, on said first layer, a second layer having an etching characteristic different from an etching characteristic of said first layer, and forming, on said second layer, a third layer having an etching characteristic different from the etching characteristic of said second layer;

removing a portion of said second layer located in a region in which a contact hole is formed in said second element-forming region, after said second layer is formed and before said third layer is formed;

forming a prescribed opening for forming a capacitor element at a portion of said first insulation film located in said first element-forming region, while forming an annular groove continuously surrounding said first element-forming region;

forming a layer that is to be a first electrode of the capacitor element on said first insulation film and on inner surfaces of said opening;

forming a protection film, in said opening, for protecting said layer to be the first electrode located within said opening;

removing said layer to be the first electrode located on an upper surface of said first insulation film, to form the first electrode in said opening;

an insulation film removal step of forming a mask material that exposes said protection film and the portion of said first insulation film located in said first element-forming region and covers said annular groove and a portion of said first insulation film located in said second element-forming region, to remove at least a part of said first insulation film;

removing said protection film;

forming a second electrode on said first electrode from which said protection film is removed, with a dielectric film interposed in between, to form a capacitor element; and forming a second insulation film on said semiconductor substrate so as to cover said capacitor element, the step of forming said first electrode being performed by polishing.

2. The method of manufacturing a semiconductor device according to claim 1, wherein said step of forming said protection film includes the step of forming a third insulation film as said protection film, and said step of removing said protection film is performed concurrently with said insulation film removal step.

3. The method of manufacturing a semiconductor device according to claim 2, wherein said step of forming said third insulation film includes the step of forming a film having an etching characteristic different from an etching characteristic of said first insulation film.

4. The method of manufacturing a semiconductor device according to claim 1, wherein said step of forming said layer to be the first electrode includes the step of performing a prescribed roughening process to form irregularities on a surface.

* * * * *